United States Patent [19]
Baier et al.

[11] Patent Number: 5,568,519
[45] Date of Patent: Oct. 22, 1996

[54] METHOD AND APPARATUS FOR SEPARATING A SIGNAL MIX

[75] Inventors: Paul-Walter Baier; Tobias Felhauer, both of Kaiserslautern; Thomas Zimmermann, Muenchen-Laim; Anja Klein, Niederkirchen, all of Germany

[73] Assignee: Siemens Aktiengesellschaft, Munich, Germany

[21] Appl. No.: 904,823

[22] Filed: Jun. 26, 1992

[30] Foreign Application Priority Data

Jun. 28, 1991 [DE] Germany ............... 41 21 356.4

[51] Int. Cl.⁶ .................. H04L 27/06; H04B 1/10
[52] U.S. Cl. .......................... 375/343; 375/350
[58] Field of Search .................. 375/95, 103, 1, 375/343, 350, 346, 200; 370/18; 364/819, 728.03

[56] References Cited

U.S. PATENT DOCUMENTS

| | | | |
|---|---|---|---|
| 3,689,750 | 9/1972 | Esser | 364/728.03 |
| 4,472,815 | 9/1984 | Gutleber | 375/96 |
| 4,487,476 | 12/1984 | Hester et al. | 382/43 |
| 4,931,977 | 6/1990 | Klemes | 364/581 |
| 4,933,952 | 6/1990 | Albrieux et al. | 375/200 |

OTHER PUBLICATIONS

"Digital Communications" by John G. Proakis, 1989, pp. 234–241.
"An Introduction To Matched Filters", by G. L. Turin, IN: Ire Transactions on Information Theory, Jun. 1960, pp. 311–329.
"Matched Filters For Radar And Satellites", by G. N. Robinson, In: Wireless World, Apr. 1984, pp. 42 and 43.

*Primary Examiner*—Tesfaldet Bacure
*Attorney, Agent, or Firm*—Hill, Steadman & Simpson

[57] ABSTRACT

A method for separating a signal mix composed of the additive superposition of M known functions that are weighted with M unknown weighting factors, whereby all or some of the functions are chronologically and/or spectrally not disjunctive. The signal mix including a potential noise signal is supplied to a signal evaluation device that, by filtering, forms true-to-expectation estimated values for the unknown weighting factors. For the first time, this provides a true-to-expectation separation of a signal mix composed of non-orthogonal functions. An apparatus for the implementation of the method forms linear combinations of the correlation products from the input signal and from the functions to be separated. Instead of the functions to be separated, versions of these functions modified according to the properties of the superimposed noise signal can also be used in the formation of the correlation products. An advantageous and cost-beneficial embodiment of the apparatus for separating the signal mix is an apparatus composed of M modified, signal-matched filters that are realized in analog or digital technology.

16 Claims, 4 Drawing Sheets

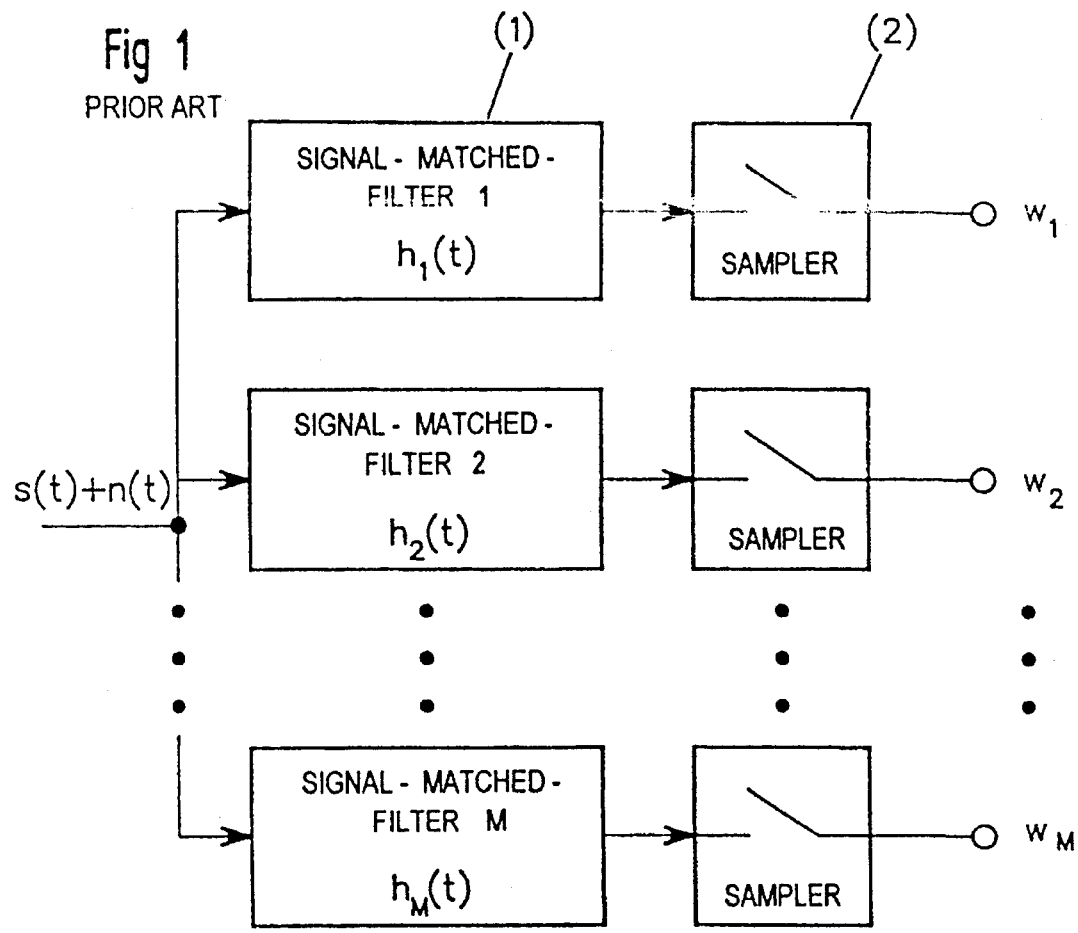
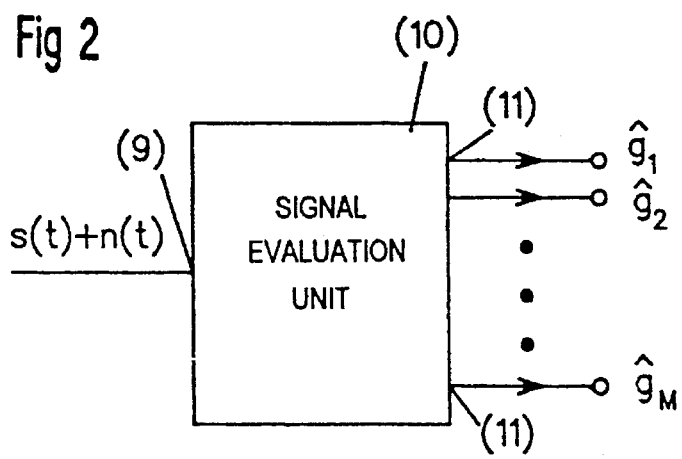

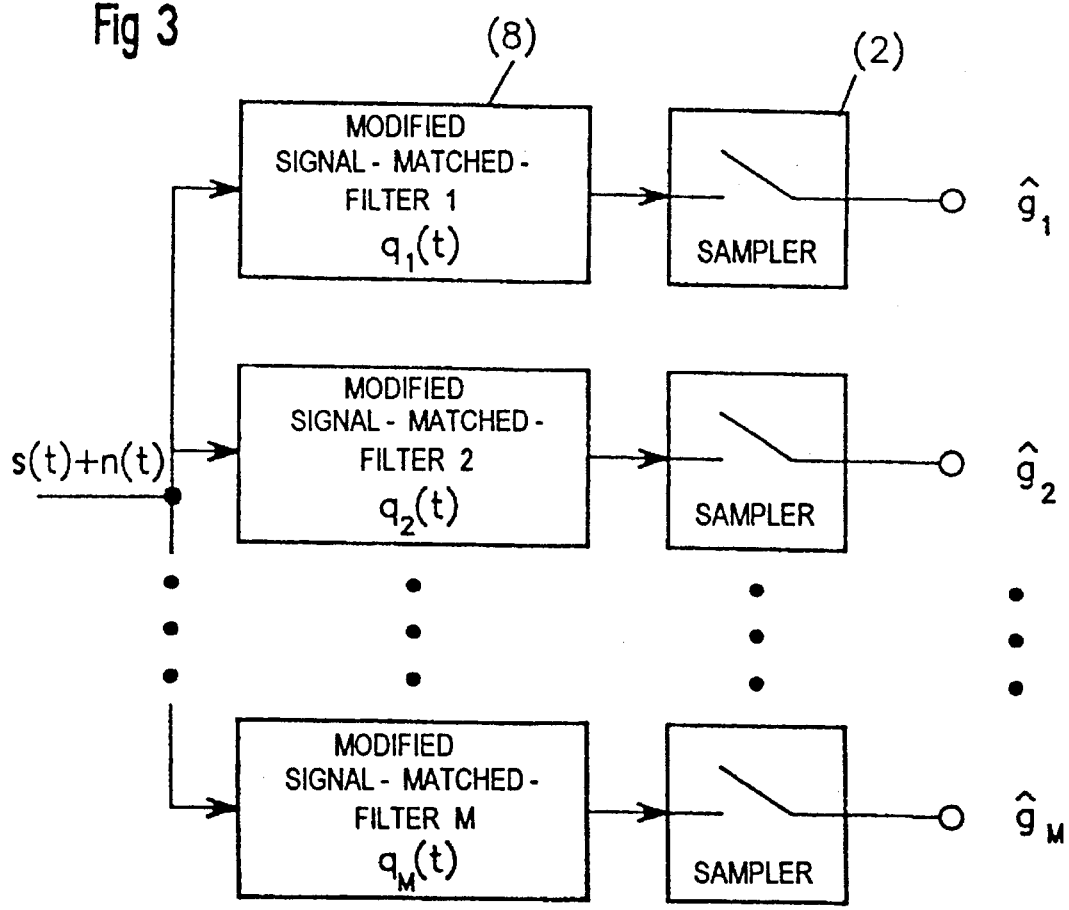

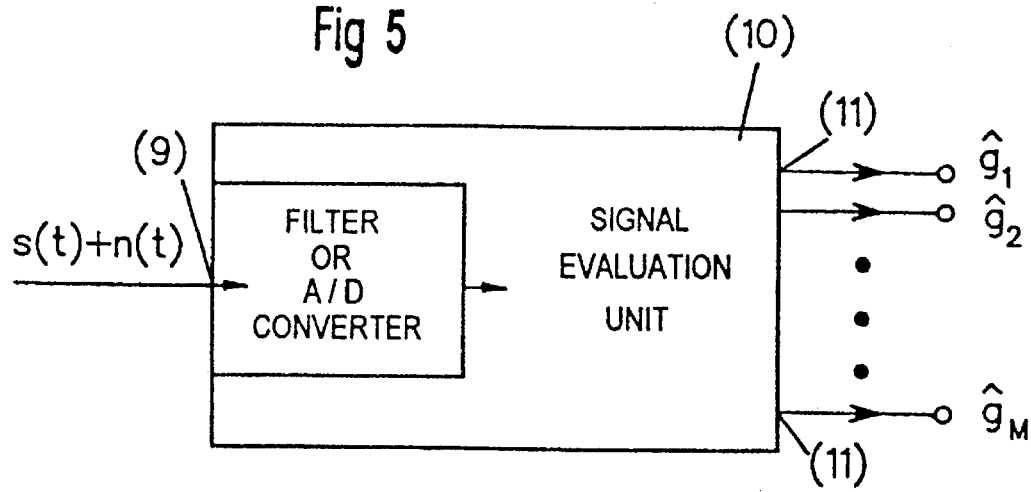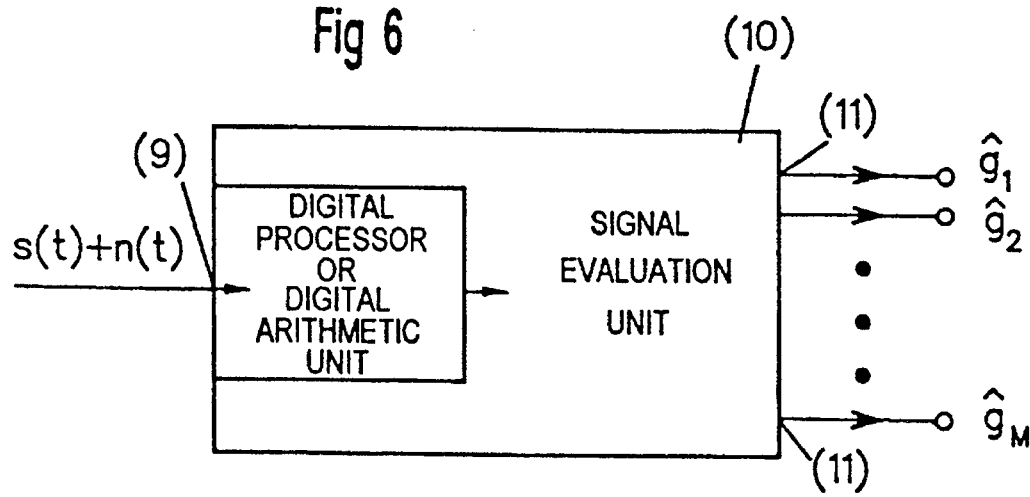

METHOD AND APPARATUS FOR SEPARATING A SIGNAL MIX

BACKGROUND OF THE INVENTION

The present invention is directed to a method and apparatus for separating a signal mix $$s(t) = \sum_{\mu=1}^{M} g_\mu \cdot f_\mu(t), \quad (1)$$

that is composed of M known, real or complex functions $f_\mu(t)$ that are weighted with the unknown weighting factors $g_\mu$, $\mu=1, 2 \ldots M$, whereby all or some of the functions $f_\mu(t)$ are chronologically and/or spectrally not disjunctive, and whereby an additional noise signal n(t) can be superimposed on the signal mix s(t).

It is assumed in the present specification that the functions $f_\mu(t)$ are real. The transition to complex functions $f_\mu(t)$ is possible without further ado. See reference #3.

It is known that the problem of signal separation is in acquiring estimated values $\hat{g}_\mu$ for the unknown weighting factors $g_\mu$ from the signal mix s(t) according to equation (1). According to the prior art (see reference #1), the estimating of the weighting factors $g_\mu$ proceeds according to a method that correlates the signal mix s(t) according to equation (1) with each of the known functions $f_\mu(t)$ and to consider the M correlation products $f_\mu$ thereby acquired as estimated values $\hat{g}_\mu$ for the unknown weighting factors $g_\mu$. FIG. 1 shows an apparatus with which this method of the prior art is implemented. This arrangement is composed of M filters (1) having the pulse responses $h_\mu(t)$, $\mu=1, 2, \ldots M$ and of M samplers (2), whereby each of the M filters (1) is signal-matched to respectively exactly one of the functions $f_\mu(t)$ and is thus independent in terms of its properties from the respective M-1 remaining functions $f_\mu(t)$. When white, Gaussian noise is assumed as noise signal n(t), signal matching means that the relationship $$h_\mu(t) = A \cdot f_\mu(T-t) \quad (2)$$

exists between the function $f_\mu(t)$ and the pulse response of the corresponding, $\mu^{th}$ signal-matched filter (see reference #2). For other types of noise signal, the pulse response $h_\mu(t)$ is to be correspondingly modified (see reference #2). The amplitude factor A and the delay time T in equation (2) can be equated with one or, respectively, zero without limiting the universality in the following considerations. Instead of signal-matched filters (1), correlators can also be utilized in the arrangement of FIG. 1 because of the known equivalency of correlation and signal-matched filtering (see reference #2).

When the signal mix s(t) according to equation (1) is supplied to the arrangement of FIG. 1, then samples $w_\mu$, $\mu=1, 2 \ldots M$ that correspond to the correlation products of the signal mix s(t) according to equation (1) and respectively one of the M functions $f_\mu(t)$, $\mu=1, 2 \ldots M$ are obtained by chronologically correct sampling of the M filter output signals with the samplers (2). When the pulse response $h_\mu(t)$ of the signal-matched filters is selected according to equation (2) and when A is equated to one and T is equated to zero, then the samples $w_\mu$ in the undisturbed case read $$w_\mu = \int_{T_{int}} s(t) \cdot f_\mu(t) dt, \quad \mu = 1, 2 \ldots M \quad (3)$$

The integration interval $T_{int}$ in equation (3) is to be selected such that the entire time domain in which the functions $f_\mu(t)$ can assume values not equal to zero is covered.

As known, the samples $w_\mu$ according to equation (3) can be considered estimated values $\hat{g}_\mu$, $\mu=1, 2 \ldots M$ of the weighting factor $g_\mu$ (see reference #1). As also known, however, these estimated values $\hat{g}_\mu$ are falsified in that the signal component $g_\mu \cdot f_\mu(t)$ of the signal mix s(t) according to equation (1) generates a voltage not only at the output of the $\mu^{th}$ signal-matched filter allocated to it but also at the outputs of the M-1 other signal-matched filters. These falsifications are referred to as bias (see reference #3). It is also reported that the estimate is not true to expectation (see reference #3). Such a bias of the estimated values $\hat{g}_\mu$ would not appear, given use of the arrangement according to FIG. 1, only in the specific instance that all functions $f_\mu(t)$ are exactly orthogonal relative to one another, this usually not being present in practice.

The appearance of the afore-mentioned bias given use of functions $f_\mu(t)$ that are not exactly orthogonal is a serious disadvantageous of the previously known method for separating a signal mix according to equation (1) and of the corresponding arrangement according to FIG. 1. According to the prior art (see reference #2), attempts are made to counter this disadvantage by using only specifically selected or, respectively, construed functions $f_\mu(t)$ that come as close as possible to the case of orthogonality. This procedure, however, has the obvious disadvantage that the selection of the functions $f_\mu(t)$ is limited. However, freedom in the selection is desirable, for example when the functions $f_\mu(t)$ are to be frequently changed in order to achieve protection against interception in a message transmission system. In many instances, the functions $f_\mu(t)$ are also prescribed, so that the possibility of selecting specific functions $f_\mu(t)$ is not established a priori. The prior art in signal separation is thus unsatisfactory.

SUMMARY OF THE INVENTION

The present invention is based on the problem of avoiding bias in the calculation of estimated values $\hat{g}_\mu$ of the weighting factor $g_\mu$ that arise in the prior art separation method and given use of the arrangement of FIG. 1 corresponding to the prior art and in the selection of non-orthogonal functions $f_\mu(t)$. This problem is inventively resolved in that a novel separation method and arrangements that are expediently expanded or, respectively, modified are used instead of the arrangement of FIG. 1.

The method of the present invention is for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on the time t that are weighted with M unknown weighting factors $g_\mu$, $\mu=1, 2 \ldots M$. All or some of the functions $f_\mu(t)$ are chronologically and/or spectrally not disjunctive (that is all or some of the functions $f_\mu(t)$ are not disjunctive in the time domain and/or in the frecuency domain). An additional noise signal n(t) that is correlated with s(t) or non-correlated can be superimposed on the signal mix s(t). In the method the signal mix s(t) including the potential noise signal n(t) is supplied to the input (9) of a signal evaluation means (10) operating analog and/or digital at whose outputs (11) can be taken linear combinations of the correlation products of the input signal and of the functions $f_\mu(t)$. Modified versions of the functions $f_\mu(t)$ can also be used in the formation of the correlation products instead of the function $f_\mu(t)$.

The advantages obtainable with the present invention are that an exact estimate of the weighting factor $g_\mu$, i.e. an estimate true to expectations is enabled even given use of non-orthogonal functions $f_\mu(t)$ and that the restrictive desire for orthogonality is not required in the selection of the functions $f_\mu(t)$.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

FIG. 1 is a block diagram of a prior art apparatus with which a method of the prior art is implemented;

FIG. 2 illustrates the method of the present invention for separation of the signal mix s(t);

FIG. 3 is a block diagram of an apparatus resulting from the method of the present invention.

FIG. 5 shows an alternative embodiment of the present invention having a filter device for separating the input signal; and FIG. 6 shows another alternative embodiment of the present invention having a processor device for separating the input signal.

DESCRIPTION OF THE PREFERRED EMBODIMENT

Figure 4:
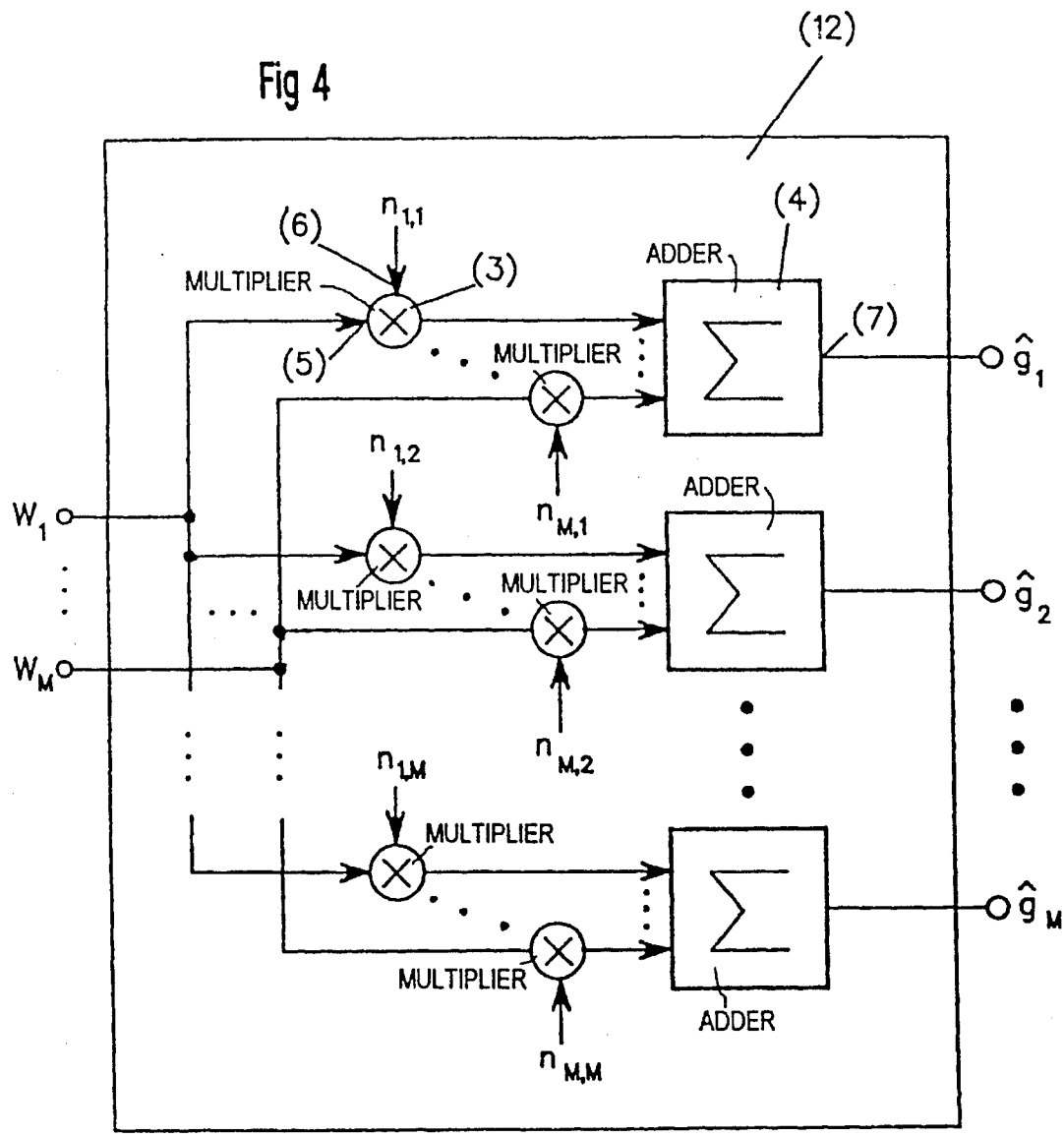
FIG. 4 is a block diagram depicting the principle of a linear combiner of the present invention.

FIG. 2 illustrates the method of the present invention for separation of the signal mix s(t). The signal mix s(t) including the potential noise signal n(t) is supplied to the input 9 of the signal evaluation unit 10 shown in FIG. 2 and the signal evaluation unit 10 forms true-to-expectation estimated values $\hat{g}_\mu$ for the weighting factor $g_\mu$ at its outputs 11 from the input signal by filtration.

The present invention proceeds on the basis of the non-obvious idea that the samples $w_\mu$ acquired in the correlation (this corresponds to the prior art) and that are acquired with the apparatus of FIG. 1 are linear combinations of the sought weighting factors $g_\mu$ when free of interference. With the vector $$g = (g_1, g_2 \ldots g_M) \tag{4}$$

of the weighting factors $g_\mu$, the vector $$w_\mu = (w_1, w_2 \ldots w_M) \tag{5}$$

of the samples $w_\mu$ and with a matrix $$M = \begin{vmatrix} m_{1,1} \ldots m_{1,M} \\ \vdots \\ m_{M,1} \ldots m_{M,M} \end{vmatrix} \tag{6}$$

the linear relationship between the samples $w_\mu$ and the weighting factors $g_\mu$ can be presented in the form $$w = g \cdot M \tag{7}$$

The elements $m_{\mu\nu}$ of the matrix M of equation (6) are the cross-correlation products of the functions $f_\mu(t)$ and $f_\nu(t)$, i.e.

$$m\mu\nu = \int_{T_{int}} f_\mu(t) f_\nu(t) dt, \mu, \nu = 1,2 \ldots M. \tag{8}$$

is valid.

As the next step in the process, the matrix $$N = M^{-1} = \begin{vmatrix} n_{1,1} \ldots n_{1,M} \\ \vdots \\ n_{M,1} \ldots n_{M,M} \end{vmatrix} \tag{9}$$

that is inverse relative to the matrix M of equation (7) is introduced. From the vector w according to equation (5) and the matrix N according to equation (9), the vector g of the weighting factors $g_\mu$ results from $$g = w \cdot N \tag{10}$$

The weighting factors $g_\mu$ can thus be described as linear combinations of the samples $w_\mu$ appearing in the arrangement of FIG. 1 at the outputs of the signal-matched filters. This perception is utilized in the present invention.

FIG. 4 shows the principle of a linear combiner 12 of the present invention. The linear combiner 12 is composed of a plurality of M·M multipliers 3 and of a plurality of M adders 4. As shown in FIG. 4, the multipliers 3 have their one input 5 supplied with the correlation products $w_\mu, \mu = 1, 2 \ldots M$ and are supplied at their other input 6 with the elements $n_{\mu 1}$ of the matrix N of equation (9). The output signals of respectively M multipliers are respectively supplied, as shown in FIG. 4, to one of the adders 4 at whose output 7 are present the true-to-expectation estimated values $\hat{g}_\mu$ of the weighting factors $g_\mu$.

Instead of the linear superposition of the filter output signals $w_\mu, \mu = 1, 2 \ldots M$ acquired with the arrangement according to FIG. 1 and according to equation (10), it is also theoretically conceivable to first linearly superpose the pulse responses $h_\mu(t)$ of the signal-matched filters 1, to sample the output signals of the nee, modified, signal-matched filters or correlators arising as a result thereof and to thereby directly obtain true-to-expectation estimated values $\hat{g}_\mu$ of the weighting factor $g_\mu$. When this non-obvious idea is applied, then the arrangement of FIG. 3 results. This is composed of M filters 8 having the pulse responses $q_\mu(t), \mu = 1, 2 \ldots M$, yet to be defined and of M samplers 2. With the vector $$h(t) = [h_1(t), /h_2(t) \ldots h_M(t)] \tag{11}$$

of the pulse responses of the signal-matched filters 1 in the arrangement of FIG. 1 and with the vector $$q(t) = [q_1(t), /q_2(t) \ldots q_M(t)] \tag{12}$$

of the pulse responses of the filters 8 to be identified in the arrangement of FIG. 3, the conditional equation $$q(t) = h(t) \cdot N \tag{13}$$

results.

Given selection of the filter pulse responses $g_{82}(t), \mu = 1, 2 \ldots M$, a true-to-expectation estimate of the weighting factors $g_{82}$ with the apparatus of FIG. 3 is possible according to equation (13) in a simple and advantageous way in that modified, signal-matched filters having the pulse responses $q_{82}(t)$ that derive from the pulse responses $h_{82}(t)$ according to equation (13) are used instead of the standard, signal-matched filters having the pulse responses $h_{82}(t), \mu = 1, 2 \ldots M$, see equation (2). By contrast to the arrangement shown in FIG. 1 which corresponds to the prior art, the arrangement of the present invention shown in FIG. 3 enables a true-to-expectation and, consequently, more exact estimation of the weighting factors $g_{82}$. Despite this improved behavior, the new arrangement of FIG. 3 does not require any greater circuit outlay than the traditional and known arrangement of FIG. 1.

Advantageous developments of the present invention are as follows.

A total of M linear combinations is formed, these being true-to-expectation estimated values for the unknown weighting factor $g_{82}$. This makes it possible to directly take estimated values for the unknown weighting factors $g_{82}$ at the outputs of the signal evaluation means.

Functions, modified such that the minimum variance and/or maximum signal-to-noise ratio of the output signals of the signal evaluation means (10) is achieved, are used instead of the functions $f_\mu(t)$ in the formation of the correlation products. In this development other functions $f'_{82}(t)$ are used in the formation of the correlation products instead of the known functions $f_\mu(t)$, these other functions $f'_\mu(t)$ deriving from the functions $f_\mu(t)$ by, for example, filtering. In this way, the signal evaluation means can be fashioned such dependent on the type of noise signal n(t) acting thereupon such that the results achieved are optimally precise. A theory of signal-matched filters for the case of colored noise is also referenced in this context (see reference #2).

It can be advantageous to undertake the formation of the correlation products in functionally separate or non-separate steps. The following two developments cover these two possibilities. The formation of the correlation products and the formation of the linear combinations can occur in functionally separate steps in the signal evaluation means (10). Alternatively, the formation of the correlation products and the formation of the linear combinations can occur in functionally non-discrete steps in the signal evaluation means (10).

An apparatus for separating a signal mix s(t) according to the method of the present invention is characterized in that the signal mix s(t) including the potential noise signal n(t) is supplied to modified, signal-matched filters or correlators (8) whose pulse responses are linear combinations of the pulse responses of filters (1) that are signal-matched to the functions $f_\mu(t)$. In this apparatus, as also shown in FIG. 3, modified, signal-matched filters 8 are employed instead of the signal-matched filters 1 of the arrangement according to FIG. 1. In an especially advantageous and cost-beneficial way, the modified, signal-matched filters 8 can be realized in the form of electro-acoustic, tapped delay lines or electro-acoustic convolvers (see reference #4). The use of such components is especially practical when the functions $f_\mu(t)$ have a large time-bandwidth product, i.e. when spread spectrum functions are involved (see reference #5). To this end the filters or correlators are realized in analog technology, particularly in the form of electro-acoustic, tapped delay lines or electro-acoustic convolvers.

The modified, signal-matched filters or correlators 8 can also be realized with digital correlators. Such digital correlators are described in detail in, for example, reference #6. The functional principles of this correlator are the following: In the case of an active correlator, the correlator consists of a multiplication device in which the incoming signal is multiplied by a reference signal, and an integrating or summing device in which the output of the multiplier is integrated or summed over a certain time prior. A passive correlator, which is also termed matched filter is a filter, the impulse response of which is (up to some delay and amplitude factor) a replica of the time reversed signal to which the filter is matched. Given employment of such digital components, a variation of the function $f_\mu(t)$ is possible in an especially simple and fast way, for example in order to achieve protection against interception given radio transmission.

Furthermore, the present invention is an apparatus for separating a signal mix s(t) according to the method of the present invention, wherein the signal mix s(t) including the potential noise signal n(t) is supplied to the filters or correlators (1) that are signal-matched to the functions $f_\mu(t)$, and wherein the filter output signals are supplied to the means (12) in which they are linearly combined. Here, the present invention is embodied such that the arrangement of FIG. 1 corresponding to the prior art is combined with the inventive arrangement of FIG. 2. This makes it possible to supplement arrangements of FIG. 1 such that a signal evaluation means 10 of the present invention arises.

The present invention also includes the inventive implementation of the signal separation wherein the signal mix is first filtered and/or supplied to an analog-to-digital converter for digitization (see FIG. 5).

A completely digital signal processing according to the inventive method for signal separation is also possible with a digital processor or other digital arithmetic unit (see FIG. 6).

The method for estimating the weighting factors $g_\mu$ based on equations (4) through (10) contains the additional possibility of obtaining quantitative statements about the precision of the estimate results, for example in the form of confidence limits. The mathematical foundations of such a procedure may be found, for example, in reference #7. The diagonal elements $n_{82\,\mu}$ of the matrix N in equation (9) are a direct measure for the variance of the estimation values $\hat{g}_\mu$ confidence limits can be defined from this variance together with knowledge of the probability density function or an assumption about the probability density function.

REFERENCES

/1/ J. Viterbi, K. Omura: Principles of digital communications and coding. McGraw-Hill, New York. 1979

/2/ A. Whalen: Detection of signals in noise. Academic Press. New York. 1971

/3/ O. Loffeld: Estimationstheorie Volume 1 and 2. Oldenbourg Verlag. Munich. 1990.

/4/ A. Oliner: Acoustic surface waves. Springer Verlag. New York. 1978

/5/ M. Simon, K. Omura, R. Scholtz, B. Levitt: Spread spectrum communications. Computer Science Press. Rockville. 1985

/6/ J. Proakis: Digital communications. McGraw-Hill. New York. 1983

/7/ R. Zurmuhl: Praktische Mathematik. Springer Verlag. Berlin. 1965.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A method for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on time t that are weighted with M unknown weighting factors $g_\mu$, $\mu=1, 2 \ldots M$, at least some of the functions $f_\mu(t)$ being not disjunctive in the time domain and/or the frequency domain, and an additional potential noise signal n(t) that is correlated with s(t) or non-correlated being superimposed on the signal mix s(t), comprising the steps of: supplying the signal mix s(t) including the potential noise signal n(t) as an input signal to an input of a signal processing unit operating in an analog and/or digital mode to produce the functions $f_\mu(t)$; forming correlation products of the input signal s(t) + n(t) and of the functions $f'_\mu(t)$, which result from the functions $f_\mu(t)$ through linear or non-linear filtering or are identical with the functions $f_\mu(t)$; and taking linear combinations of the correlation products $w=(w_1, w_2 \ldots w_M)$ with the covariance matrix C of the functions $f_\mu(t)$ and $f'_\mu(t)$ according to the relation $w \cdot C^{-1}$ and; using said linear combinations, that are output by the processing unit, as true-to-expectation estimated values of the unknown weighting factors $g_\mu$ for separating the signal mix s(t).

2. The method according to claim 1, wherein a total of M linear combinations is formed that are true-to-expectation estimated values of the unknown weighting factors $g_\mu$.

3. The method according to claim 1, wherein modified versions of the functions $f_\mu(t)$ are obtained by one of linear or nonlinear filtering and wherein the modified versions of the functions $f_\mu(t)$ are derived from the functions $f_\mu(t)$.

4. The method according to claim 1, wherein the formation of the correlation products and the formation of the linear combinations occur in functionally separate steps in the signal processing unit.

5. The method according to claim 1, wherein the formation of the correlation products and the formation of the linear combinations occur in functionally non-discrete steps in the signal processing unit.

6. An apparatus for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on time t that are weighted with M unknown weighting factors $g_\mu$, $\mu=1, 2 \ldots M$, at least some of the functions $f_\mu(t)$ being not disjunctive in the time domain and/or in the frequency domain, and an additional potential noise signal n(t) that is correlated with s(t) or non-correlated being superimposed on the signal mix s(t), comprising:

a signal processing unit having an input and a plurality of outputs, the signal mix s(t) being supplied to the input of the signal processing unit;

in the signal processing unit modified signal-matched filters or correlators, whose pulse responses are linear combinations of pulse responses of signal-matched filters that are signal-matched to the functions $f_\mu(t)$, receiving the inputted signal mix s(t); and in the signal processing unit a linear combiner connected to said filters or correlators for forming linear combinations of correlation products of the inputted signal mix s(t) and of the functions $f_\mu(t)$ at the outputs of the signal processing unit, said linear combinations being true-to-expectation estimated values of the unknown weighting factors $g_\mu$ for separating the signal mix s(t);

wherein correlation products $w=(w_1, w_2, \ldots w_M)$ are formed from the input signal s(t)+n(t) and from functions $f'_\mu(t)$, which result from the functions $f_\mu(t)$ through linear or non-linear filtering or are identical with the functions $f_\mu(t)$, and wherein linear combinations are formed according to a relation $w \cdot C^{-1}$ from the correlation products w 32 $(w_1, w_2, \ldots w_M)$ with a covariance matrix C of the functions $f_\mu(t)$ and $f'_\mu(t)$.

7. The apparatus according to claim 6, wherein the filters or correlators are analog filters or analog correlators, respectively, particularly in the form of electro-acoustic, tapped delay lines or electro-acoustic convolvers.

8. The apparatus according to claim 6, wherein the modified, signal-matched filters or correlators are digital modified, signal-matched filters or correlators, respectively. (that is all or some of the functions $f_\mu(t)$ are not disjunctive in the time domain and/or in the frequency domain).

9. An apparatus for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on time t that are weighted with M unknown weighting factors $g_\mu$, $\mu=1, 2 \ldots M$, at least some of the functions $f_\mu(t)$ being not disjunctive in the time domain and/or in the frequency domain, and an additional potential noise signal n(t) that is correlated with s(t) or non-correlated being superimposed on the signal mix s(t), comprising:

a signal processing unit having an input and a plurality of outputs, the signal mix s(t) being supplied to the input of the signal processing unit;

in the signal processing unit filters or correlators, that are signal-matched to the functions $f_\mu(t)$, receiving the inputted signal mix s(t) and forming filter output signals; and in the signal processing unit a linear combiner receiving the filter output signals and forming linear combinations of correlation products of the inputted signal mix s(t) and of the functions $f_\mu(t)$ at the outputs of the signal processing unit, said linear combinations being true-to-expectation estimated values of the unknown weighting factors $g_\mu$ for separating the signal mix s(t);

wherein correlation products $w=(w_1, w_2 \ldots w_M)$ are formed from the input signal s(t)+n(t) and from functions $f_\mu(t)$, which result from the functions $f_{\mu'}(t)$ through linear or non-linear filtering or are identical with the functions $f_\mu(t)$, and wherein linear combinations are formed according to a relation $w \cdot C^{-1}$ from the correlation products $w=(w_1, w_2, \ldots w_M)$ with a covariance matrix C of the functions $f_\mu(t)$ and $f_\mu'(t)$.

10. An apparatus for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on time t that are weighted with M unknown weighting factors $g_\mu$, $\mu=1, 2 \ldots M$, at least some of the functions $f_\mu(t)$ being not disjunctive in the time domain and/or in the frequency domain, and an additional potential noise signal n(t) that is correlated with s(t) or non-correlated being superimposed on the signal mix s(t), comprising:

a signal processing unit having an input and a plurality of outputs, the signal mix s(t) being supplied to the input of the signal processing unit:

in the signal processing unit modified signal-matched filters or correlators, whose pulse responses are linear combinations of pulse responses of signal-matched filters that are signal-matched to the functions $f_\mu(t)$, receiving the inputted signal mix s(t); and in the signal processing unit a linear combiner connected to said filters or correlators for forming linear combinations of correlation products of the inputted signal mix s(t) and of the functions $f_\mu(t)$ at the outputs of the signal processing unit, said linear combinations being true-to-expectation estimated values of the unknown weighting factors $g_\mu$ for separating the signal mix s(t);

wherein correlation products $w=(w_1, w_2, \ldots w_M)$ are formed from the input signal s(t)+n(t) and from functions $f_\mu'(t)$, which result from the functions $f_\mu(t)$ through linear or non-linear filtering or are identical with the functions $f_\mu(t)$, and, wherein linear combinations are formed according to a relation w·C from the correlation products $w=(w_1, w_2, \ldots w_M)$ with a covariance matrix C of the functions $f_\mu(t)$ and $f'_\mu(t)$.

11. An apparatus for separating a signal mix $$s(t) = \sum_{\mu=1}^{M} g_\mu \cdot f_\mu(t),$$

that is composed of M known real or complex functions $f_\mu(t)$, $\mu=1, 2 \ldots M$, dependent on time t that are weighted with M unknown weighting factors $g_\mu$, $\mu=1, 2 \ldots M$, at least some of the functions $f_\mu(t)$ being not disjunctive in the time domain and/or in the frequency domain, and an additional potential noise signal n(t) that is correlated with s(t) or non-correlated being superimposed on the signal mix s(t), comprising:

a signal processing unit having an input and a plurality of outputs;

the signal mix s(t) being supplied to the input of the signal processing unit;

in the signal processing unit at least one of a digital processor and a digital arithmetic unit connected to said input and outputting a processed signal mix s(t);

in the signal processing unit filters or correlators, that are signal-matched to the functions $f_\mu(t)$, receiving the processed signal mix s(t) and forming filter output signals; and in the signal processing unit a linear combiner receiving the filter output signals and forming linear combinations of correlation products of the inputted signal mix s(t) and of the functions $f_\mu(t)$ at the outputs of the signal processing unit, said linear combinations being true-to-expectation estimated values of the unknown weighting factors $g_\mu$ for separating the signal mix s(t);

wherein correlation products $w=(w_1, w_2, \ldots w_M)$ are formed from the input signal s(t)+n(t) and from functions $f_\mu'(t)$, which result from the functions $f_\mu(t)$ through linear or non-linear filtering or are identical with the functions $f_\mu(t)$, and wherein linear combinations are formed according to a relation $w \cdot C^{-1}$ from the correlation products $w=(w_1, w_2, \ldots w_M)$ with a covariance matrix C of the functions $f_\mu(t)$ and $f_\mu'(t)$.

12. The method according to claim 1, wherein the linear combinations are estimated values for the weighting factors, and wherein the method further comprises determining signal-to-noise-ratios of these estimated values.

13. The apparatus according to claim 6, wherein said apparatus further comprises means for modifying the functions $f_\mu(t)$ and wherein the modified functions $f_\mu(t)$ are derived from the functions $f_\mu(t)$.

14. The apparatus according to claim 9, wherein said apparatus further comprises means for modifying the functions $f_\mu(t)$ and wherein the modified functions $f_\mu(t)$ are derived from the functions $f_\mu(t)$.

15. The apparatus according to claim 10, wherein said apparatus further comprises means for modifying the functions $f_\mu(t)$ and wherein the modified functions $f_\mu(t)$ are derived from the functions $f_\mu(t)$.

16. The apparatus according to claim 11, wherein said apparatus further comprises means for modifying the functions $f_\mu(t)$ and wherein the modified functions $f_\mu(t)$ are derived from the functions $f_\mu(t)$.

* * * * *